United States Patent
Seo et al.

(10) Patent No.: US 9,991,234 B2
(45) Date of Patent: Jun. 5, 2018

(54) SEMICONDUCTOR PACKAGE

(71) Applicant: Samsung Electronics Co., Ltd., Suwon-si (KR)

(72) Inventors: Gwang Sun Seo, Jeonju-si (KR); Myung Sung Kang, Yongin-si (KR); Won Keun Kim, Hwaseong-si (KR); Jin Woo Park, Seoul (KR); Yong Won Choi, Hwaseong-si (KR)

(73) Assignee: Samsung Electronics Co., Ltd. (KR)

( * ) Notice: Subject to any disclaimer, the term of this patent is extended or adjusted under 35 U.S.C. 154(b) by 0 days. days.

(21) Appl. No.: 15/401,341

(22) Filed: Jan. 9, 2017

(65) Prior Publication Data

US 2017/0365582 A1 Dec. 21, 2017

(30) Foreign Application Priority Data

Jun. 20, 2016 (KR) .................. 10-2016-0076669

(51) Int. Cl.
| | |
|---|---|
| *H01L 23/48* | (2006.01) |
| *H01L 25/065* | (2006.01) |
| *H01L 23/31* | (2006.01) |
| *H01L 23/00* | (2006.01) |

(52) U.S. Cl.
CPC ...... *H01L 25/0657* (2013.01); *H01L 23/3128* (2013.01); *H01L 24/33* (2013.01); *H01L 25/0652* (2013.01); *H01L 2225/06513* (2013.01); *H01L 2225/06517* (2013.01); *H01L 2225/06541* (2013.01); *H01L 2225/06562* (2013.01)

(58) Field of Classification Search
CPC ............ H01L 25/0657; H01L 25/0652; H01L 23/3128; H01L 24/33; H01L 2225/06513; H01L 2225/06517; H01L 2225/06541; H01L 2225/06562
USPC ...................................................... 257/774
See application file for complete search history.

(56) References Cited

U.S. PATENT DOCUMENTS

| | | | |
|---|---|---|---|
| 7,795,741 | B2 | 9/2010 | Kikuchi et al. |
| 7,948,089 | B2 | 5/2011 | Chung et al. |
| 8,846,448 | B2 | 9/2014 | Chen et al. |
| 9,287,233 | B2 | 3/2016 | Chen et al. |
| 2004/0163843 | A1 | 8/2004 | Shin et al. |
| 2007/0052089 | A1 | 3/2007 | Kim et al. |
| 2008/0036082 | A1* | 2/2008 | Eun .................. H01L 21/76898 257/737 |
| 2008/0237894 | A1 | 10/2008 | Kim |
| 2009/0029504 | A1 | 1/2009 | Paik et al. |
| 2011/0193229 | A1* | 8/2011 | Ma ........................ H01L 21/561 257/738 |

(Continued)

FOREIGN PATENT DOCUMENTS

| | | |
|---|---|---|
| JP | 2010123666 | 6/2010 |
| JP | 2012216651 | 11/2012 |

(Continued)

*Primary Examiner* — Tu-Tu Ho
(74) *Attorney, Agent, or Firm* — Onello & Mello, LLP

(57) ABSTRACT

A semiconductor package includes a substrate, a plurality of semiconductor chips stacked on the substrate, and a plurality of bonding layers bonded to lower surfaces of the plurality of semiconductor chips. The plurality of bonding layers may be divided into a plurality of groups, each having different physical properties depending on a distance from the substrate.

20 Claims, 13 Drawing Sheets

(56) References Cited

U.S. PATENT DOCUMENTS

| | | | |
|---|---|---|---|
| 2012/0070939 A1* | 3/2012 | Dunne | H01L 21/563 438/110 |
| 2012/0292787 A1* | 11/2012 | Nam | H01L 23/13 257/777 |
| 2013/0200530 A1 | 8/2013 | Song et al. | |
| 2014/0084456 A1* | 3/2014 | Kang | H01L 21/563 257/737 |

FOREIGN PATENT DOCUMENTS

| KR | 1020060076456 | 7/2006 |
|---|---|---|
| KR | 100838647 | 6/2008 |
| KR | 100894173 | 4/2009 |
| KR | 1020110030088 | 3/2011 |
| KR | 1020110049509 | 5/2011 |
| KR | 20130143667 | 12/2013 |

\* cited by examiner

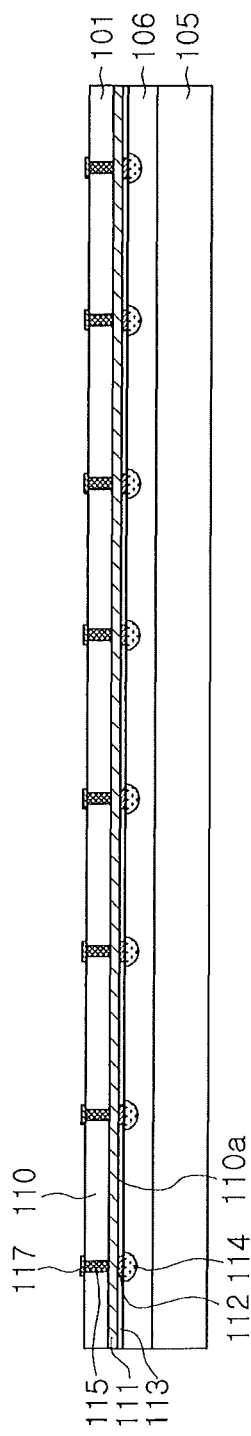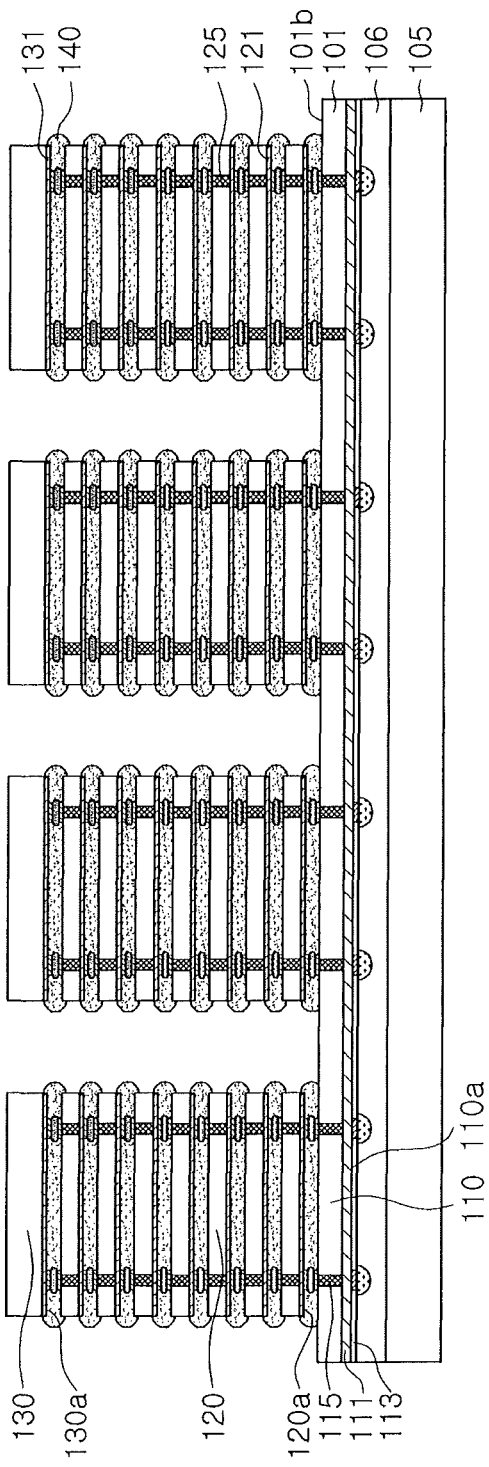
FIG. 7
FIG. 8

SEMICONDUCTOR PACKAGE

CROSS-REFERENCE TO RELATED APPLICATION

This application claims benefit of priority to Korean Patent Application No. 10-2016-0076669 filed on Jun. 20, 2016 in the Korean Intellectual Property Office, the disclosure of which is incorporated herein by reference in its entirety.

BACKGROUND

1. Field

Inventive concepts relate to a semiconductor package.

2. Description of Related Art

Due to the rapid development of the electronics industry and user demand, electronic devices have been miniaturized, multifunctionalized, and increased in storage capacity. Therefore, there has been demand for semiconductor packages used in electronic devices to be miniaturized, multifunctionalized, and increased in storage capacity. To meet these demands, semiconductor packages including a plurality of semiconductor chips have been developed.

SUMMARY

A semiconductor package in accordance with principles of inventive concepts may have reduced warpage and improved reliability.

In accordance with principles of inventive concepts, a semiconductor package may include a substrate, a plurality of semiconductor chips stacked on the substrate, and a plurality of bonding layers bonded to lower surfaces of the plurality of semiconductor chips. In addition, the plurality of bonding layers may be divided into a plurality of groups having different physical properties depending on a distance from the substrate.

In accordance with principles of inventive concepts, a semiconductor package may include a substrate and a plurality of semiconductor chips stacked on the substrate through bonding layers having different physical properties.

In accordance with principles of inventive concepts, a semiconductor package may include a substrate, semiconductor chips stacked on the substrate, through vias penetrating through the semiconductor chips, bumps disposed between the semiconductor chips and connected to the through vias, bonding layers disposed between the semiconductor chips, surrounding the bumps, and having different physical properties, and a molding portion surrounding the semiconductor chips and the bonding layers.

In exemplary embodiments in accordance with principles of inventive concepts, a semiconductor package includes a substrate, first, second, and third groups of at least one semiconductor chip each, stacked on the substrate, through vias penetrating through the semiconductor chips, bumps disposed between the semiconductor chips and connected to the through vias, bonding layers disposed between the semiconductor chips, surrounding the bumps, each bonding layer having different physical properties depending upon the distance from the substrate and a molding portion surrounding the semiconductor chips and the bonding layers.

BRIEF DESCRIPTION OF DRAWINGS

The above and other aspects, features and other advantages of inventive concepts will be more clearly understood from the following detailed description taken in conjunction with the accompanying drawings, in which:

FIGS. 7 to 11 are views illustrating a method of manufacturing a semiconductor package according to an example embodiment;

DETAILED DESCRIPTION

A semiconductor package in accordance with principles of inventive concepts may include a plurality of semiconductor chips stacked on a substrate, with bonding layers therebetween. A physical property of each bonding layer, such as coefficient of thermal expansion, Young's modulus, degree of curing shrinkage, or layer thickness, may be varied in order to counteract warpage of the overall package and to thereby improve reliability.

Figure 1:
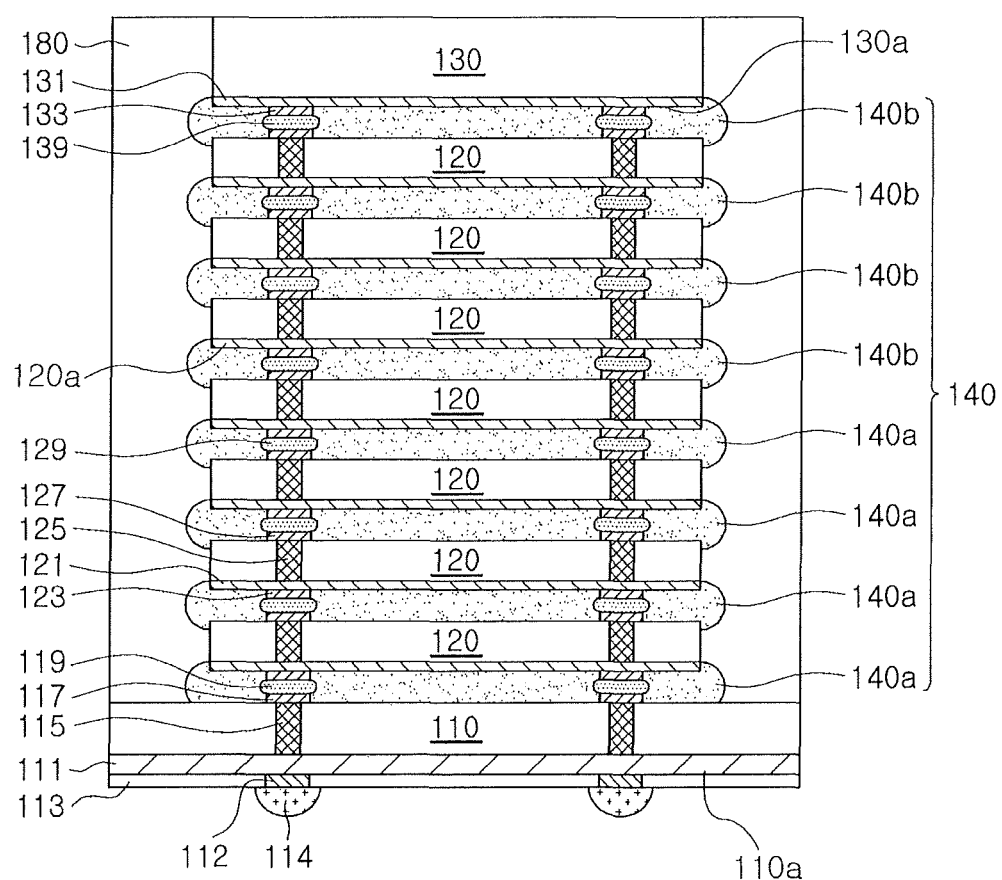
FIG. 1 is a cross-sectional view of a semiconductor package according to an example embodiment of the present inventive concept.

FIG. 1 is a cross-sectional view of an example embodiment of a semiconductor package in accordance with principles of inventive concepts.

With reference to FIG. 1, a semiconductor package 100 may include a first semiconductor chip 110, a second semiconductor chip 120, and a third semiconductor chip 130, stacked in sequence. In addition, the semiconductor package 100 may include a first bonding layer 140a and a second bonding layer 140b.

The first semiconductor chip 110 may include a semiconductor material, such as silicon, and may include a circuit wiring layer 111 and a through via 115. The first semiconductor chip 110 may be construed as a substrate including second semiconductor chips 120 mounted thereon. The circuit wiring layer 111 may be disposed to be adjacent to a lower surface 110a of the first semiconductor chip 110. The circuit wiring layer 111 may include an integrated circuit, such as a memory circuit, a logic circuit, or combinations thereof, for example. The through via 115 may penetrate through the first semiconductor chip 110 to be electrically connected to the circuit wiring layer 111. A silicon nitride layer 113 may cover the circuit wiring layer 111. An external solder ball 114 may be disposed on the lower surface 110a of the first semiconductor chip 110, and may be electrically connected to the circuit wiring layer 111 by a pad 112. The lower surface 110a of the first semiconductor chip 110 may act as an active surface. The through via 115 may include a connection pad 117 formed thereon.

The first semiconductor chip 110 may include a plurality of second semiconductor chips 120 stacked thereon, and second semiconductor chips 120 may include an integrated circuit layer 121 and a through via 125. In example embodiments, the integrated circuit layer 121 may include a memory circuit. The through via 125 may penetrate through the second semiconductor chip 120 to be electrically connected to the integrated circuit layer 121. Conductive pads 123 and 127 connected to the through via 125 may be formed. A lower surface 120a of the second semiconductor chip 120 may act as the active surface. A first bump 119 may be formed on the lower surface 120a of the second semiconductor chip 120 to allow the second semiconductor chip 120 to be electrically connected to the first semiconductor chip 110. In example embodiments, the first bump 119 may be formed between the first semiconductor chip 110 and the second semiconductor chip 120. The first bump 119 may be in contact with a conductive pad 123. Seven second semiconductor chips 120 are illustrated as being stacked on the first semiconductor chip 110 in the example embodiment of FIG. 1, but inventive concepts are not limited thereto; the number of the second semiconductor chips 120 may be varied, for example. In embodiments in which a plurality of second semiconductor chips 120 are mounted, a second bump 129 may be formed between the second semiconductor chips 120. Through the second bump 129, the second semiconductor chips 120 may be electrically connected to each other. The second bump 129 may be in contact with the conductive pads 123 and 127.

The third semiconductor chip 130 may be mounted on the second semiconductor chip 120. A lower surface 130a of the third semiconductor chip 130 may act as an active surface. In addition, an integrated circuit layer 131 may include the memory circuit. In example embodiments, the third semiconductor chip 130 may vary from the first semiconductor chip 110 and the second semiconductor chip 120 by not including a through via, and may have a thickness different from that of the second semiconductor chip 120. In example embodiments, the third semiconductor chip 130 may be thicker than the second semiconductor chip 120. By controlling a thickness of the third semiconductor chip 130, the final thickness of the completed semiconductor package may be controlled. A third bump 139 may be formed between the second semiconductor chip 120 and the third semiconductor chip 130. The third semiconductor chip 130 may be electrically connected to the second semiconductor chip 120 by the third bump 139. However, in example embodiments, the third semiconductor chip 130 may be omitted.

A bonding layer 140 may be formed among semiconductor chips 110, 120, and 130. In example embodiments, the bonding layer 140 may be provided as a non-conductive polymer tape including an insulating material. The bonding layer 140 may be interposed between bumps 119, 129, and 139 to prevent electrical shorts from occurring between the bumps 119, 129, and 139.

The first bump 119, the second bump 129, and the bonding layer 140 may be bonded to the lower surface 120a of respective second semiconductor chips 120, and the second semiconductor chip 120 may be stacked on the first semiconductor chip 110 so that the lower surface 120a of the second semiconductor chip 120 may be oriented in a direction of an upper surface 100b of the first semiconductor chip 110. The third bump 139 and the bonding layer 140 may be bonded to the lower surface 130a of the third semiconductor chip 130, and the third semiconductor chip 130 may be stacked on the second semiconductor chip 120 so that the lower surface 130a of the third semiconductor chip 130 may be oriented in the direction of the upper surface 100b of the first semiconductor chip 110.

In an example embodiment, the first bonding layer 140a bonded to the lower surface 120a of four second semiconductor chips 120 disposed adjacently to the first semiconductor chip 110 may have physical properties different from that of the second bonding layer 140b bonded to the lower surface 120a of three remaining second semiconductor chips 120 and the lower surface 130a of the third semiconductor chip 130. The first bonding layer 140a and the second bonding layer 140b may have different degrees of curing shrinkage. In an example embodiment, the first bonding layer 140a may have a degree of curing shrinkage higher than that of the second bonding layer 140b. Conversely, in an example embodiment, the first bonding layer 140a may have the degree of curing shrinkage lower than that of the second bonding layer 140b. The first bonding layer 140a and the second bonding layer 140b may be selected to reduce warpage of the semiconductor package 100. In example embodiments, in a case in which the second semiconductor chip 120 and the third semiconductor chip 130 are stacked on the first semiconductor chip 110 using only the first bonding layer 140a, thus causing downwardly-concave warpage, that is, 'smiling' warpage, the second bonding layer 140b having the degree of curing shrinkage lower than that of the first bonding layer 140a disposed adjacently to the first semiconductor chip 110 may be selected, thus reducing 'smiling' warpage. Conversely, in example embodiments in which the second semiconductor chip 120 and the third semiconductor chip 130 are stacked on the first semiconductor chip 110 using only the first bonding layer 140a, thus causing upwardly-concave warpage, that is, 'crying' warpage, the second bonding layer 140b having the degree of curing shrinkage higher than that of the first bonding layer 140a disposed adjacently to the first semiconductor chip 110 may be selected, thus reducing 'crying' warpage.

Additionally, the first bonding layer 140a and the second bonding layer 140b may have different coefficients of thermal expansion. Coefficients of thermal expansion of the first bonding layer 140a and the second bonding layer 140b may have a tendency the same as the degrees of curing shrinkage of the first bonding layer 140a and the second bonding layer 140b. That is, a bonding layer having a relatively high degree of curing shrinkage may also have a relatively high coefficient of thermal expansion. In accordance with principles of inventive concepts, in the same method as in the case of curing shrinkage described above, the first bonding layer 140a and the second bonding layer 140b having different coefficients of thermal expansion may be selected to reduce warpage.

A bonding layer having the relatively high degree of curing shrinkage may have a relatively low Young's modulus, and may have a relatively low glass transition temperature (Tg).

The semiconductor package 100 may further include a molded film 180 covering the second semiconductor chip 120 and bonding layer 140.

The molded film 180 may include a vertical side wall. The vertical side wall of the molded film 180 may be coplanar with a side wall of the first semiconductor chip 110. The vertical side wall of the molded film 180 may be disposed in parallel with a direction perpendicular to an upper surface of the first semiconductor chip 110. The vertical side wall of the molded film 180 may be disposed to be spaced apart from the second semiconductor chip 120 and the third semiconductor chip 130. The molded film 180 may allow an upper surface of the third semiconductor chip 130 to be exposed.

FIGS. 2 to 6 are cross-sectional views of a semiconductor package according to example embodiments. Because example embodiments of FIGS. 2 to 6 have a composition substantially the same as that of an example embodiment described with reference to FIG. 1, except a bonding layer, a detailed description of other elements will not be repeated here and only a description of the bonding layer will be provided, hereinafter, in detail.

Figure 2:
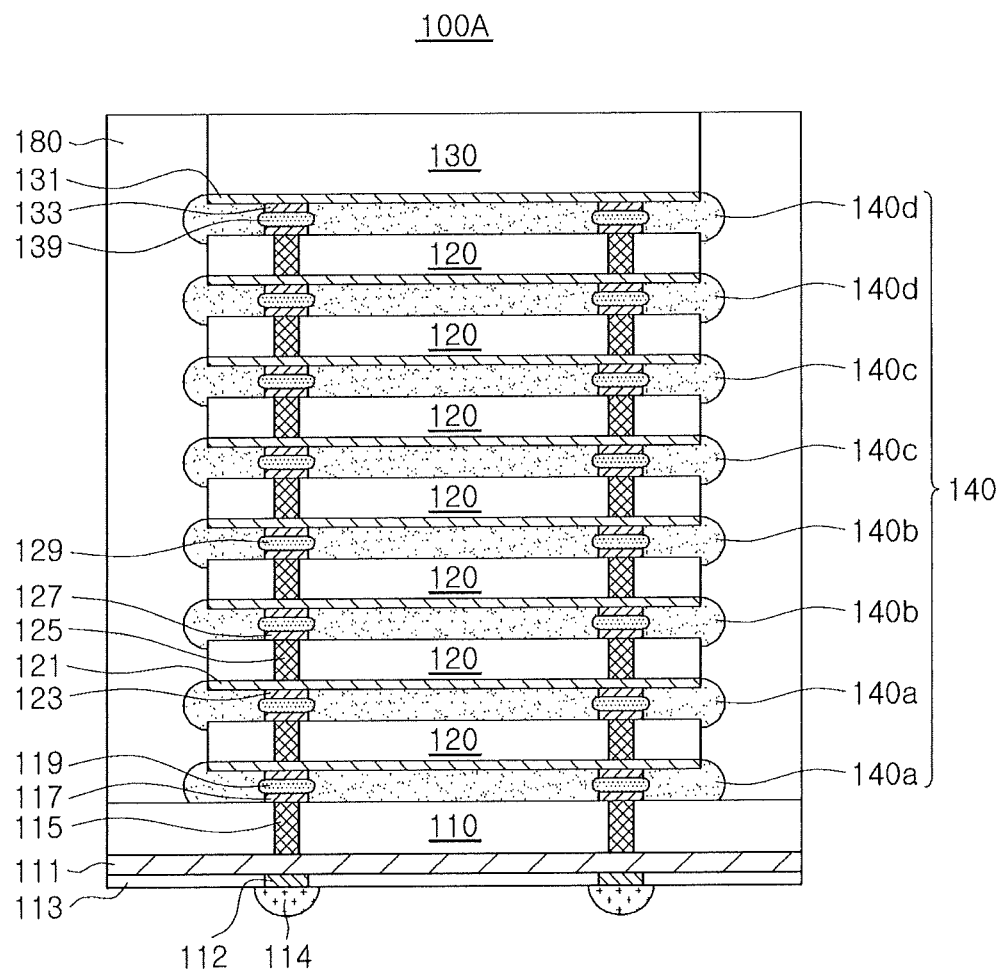
FIGS. 2 to 6 are cross-sectional views of a semiconductor package according to example embodiments.

With reference to FIG. 2, in the example embodiment, a semiconductor package 100A may include a plurality of bonding layers 140 having different physical properties depending on a distance from a first semiconductor chip 110. The plurality of bonding layers 140 may be divided into four groups having different degrees of curing shrinkage, depending on the distance from the first semiconductor chip 110.

In order to reduce warpage of the semiconductor package 100A, in an example embodiment, a degree of curing shrinkage of each group may be reduced in a direction away from the first semiconductor chip 110. In other words, the degree of curing shrinkage may be reduced in a direction from a bonding layer 140a of a first group toward a bonding layer 140d of a fourth group. Conversely, in other example example embodiments, the degree of curing shrinkage of each group may be increased in the direction away from the first semiconductor chip 110. In other words, the degree of curing shrinkage may be increased in the direction from the bonding layer 140a of the first group toward the bonding layer 140d of the fourth group.

Figure 3:
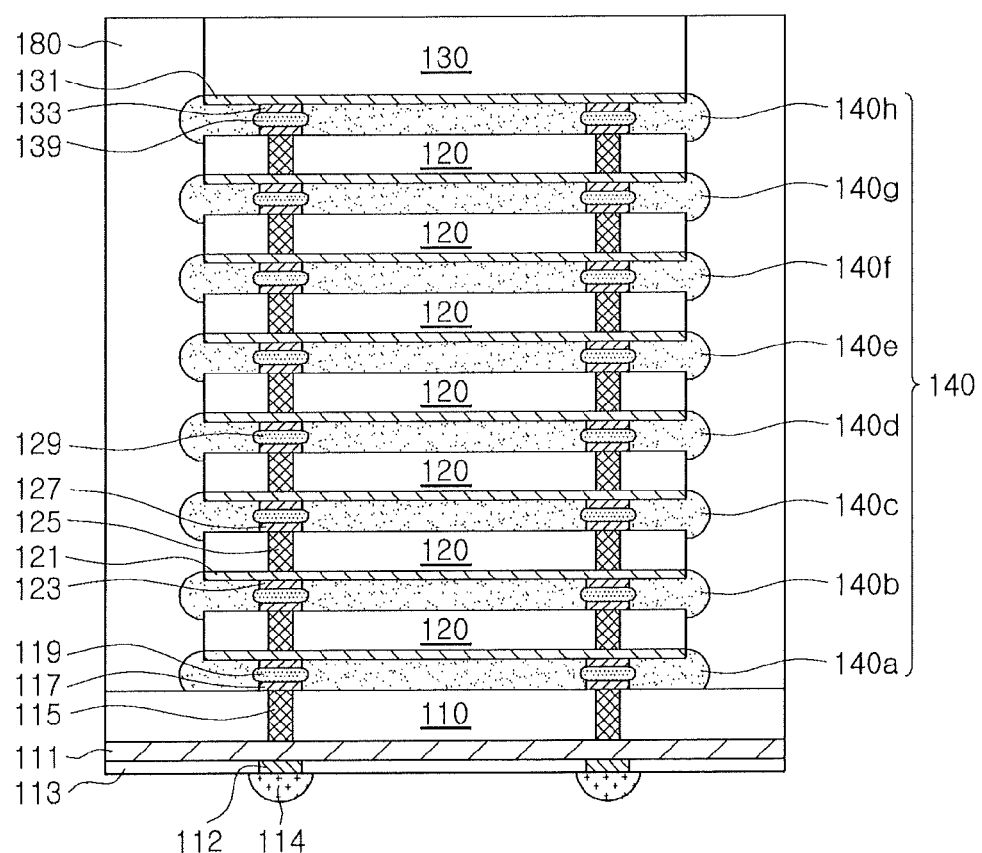

With reference to FIG. 3, in example embodiments, a semiconductor package 100B may include a plurality of bonding layers 140 having different physical properties depending on the distance from the first semiconductor chip 110. In example embodiments, eight bonding layers 140a, 140b, 140c, 140d, 140e, 140f, 140g, and 140h may be divided into eight groups having different degrees of curing shrinkage depending on the distance from the first semiconductor chip 110.

In order to reduce warpage of the semiconductor package 100B, in example embodiments, the degree of curing shrinkage of respective bonding layers 140a, 140b, 140c, 140d, 140e, 140f, 140g, and 140h may be gradually reduced in the direction away from the first semiconductor chip 110. Conversely, other example embodiments, the degree of curing shrinkage of respective bonding layers 140a, 140b, 140c, 140d, 140e, 140f, 140g, and 140h may be gradually increased in the direction away from the first semiconductor chip 110.

Figure 4:
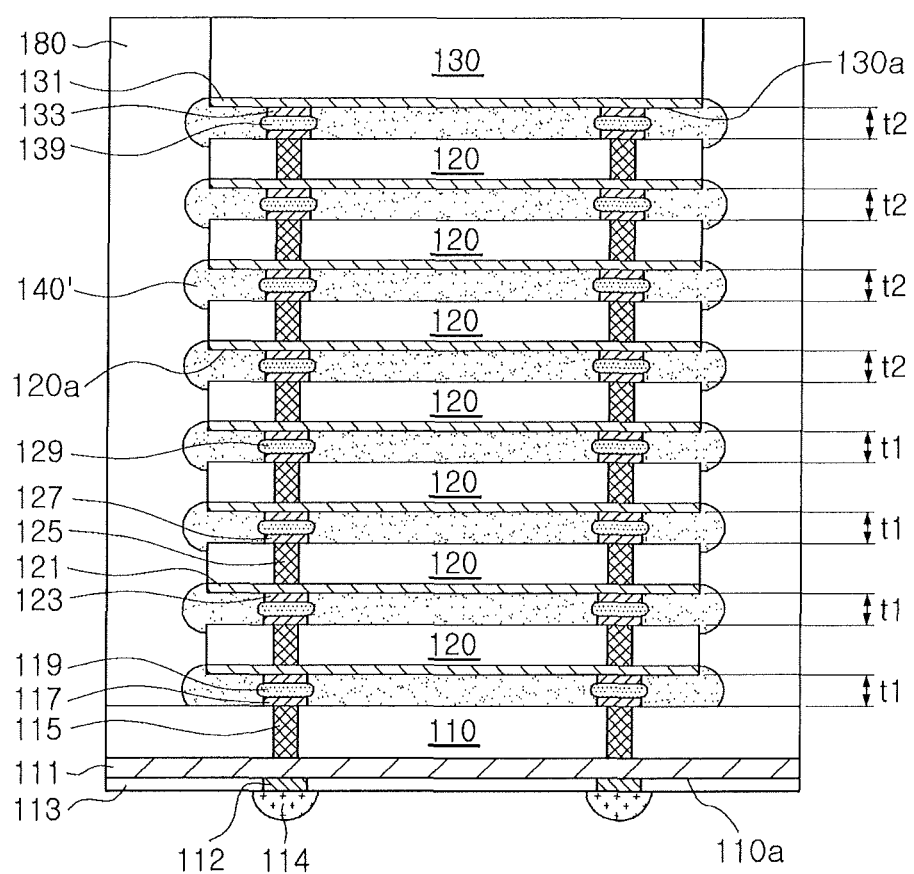

With reference to FIG. 4, in the example embodiment, a thickness t1 of bonding layers 140' bonded to a lower surface 120a of four second semiconductor chips 120 disposed adjacently to the first semiconductor chip 110 may be different from a thickness t2 of the bonding layers 140' bonded to the lower surface 120a of three remaining semiconductor chips 120 and a lower surface 130a of a third semiconductor chip 130, in the semiconductor package 100C. In example embodiments, the thickness t1 of four bonding layers 140' disposed adjacently to the first semiconductor chip 110 may be greater than the thickness t2 of three remaining bonding layers 140'. Conversely, in other example embodiments, the thickness t1 of four bonding layers 140' disposed adjacently to the first semiconductor chip 110 may be less than the thickness t2 of three remaining bonding layers 140'.

The thickness of the bonding layer 140' may be selected to reduce warpage of the semiconductor package 100C. In example embodiments, in example embodiments in which the second semiconductor chip 120 and the third semiconductor chip 130 are stacked on the first semiconductor chip 110 using the bonding layer 140' having the same thickness, thus causing downwardly-concave warpage, that is, 'smiling' warpage, the thickness t1 of the bonding layer 140' disposed adjacently to the first semiconductor chip 110 may be formed to be relatively increased, thus reducing 'smiling' warpage. Conversely, in example embodiments in which the second semiconductor chip 120 and the third semiconductor chip 130 are stacked on the first semiconductor chip 110 using the bonding layer 140' having the same thickness, thus causing upwardly-concave warpage, that is, 'crying' warpage, the thickness t1 of the bonding layer 140' disposed adjacently to the first semiconductor chip 110 may be formed to be relatively reduced (that is, thinner), thus reducing 'crying' warpage. In example embodiments, curing shrinkage of the bonding layer 140', formed to be thick, may cause a relatively high amount of compressive stress.

Figure 5:
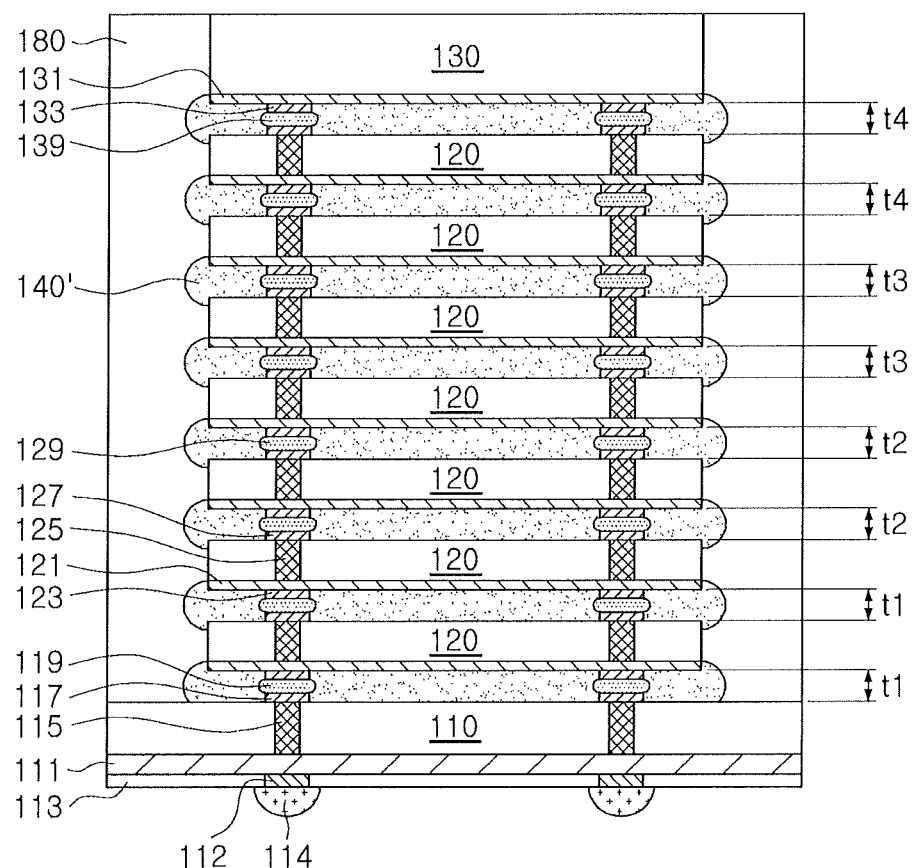

With reference to FIG. 5, in example embodiments, a semiconductor package 100D may include a plurality of bonding layers 140' including the same material and having different thicknesses depending on the distance from the first semiconductor chip 110. The plurality of bonding layers 140' may be divided into four groups having different thicknesses depending on the distance from the first semiconductor chip 110.

In order to reduce warpage of the semiconductor package 100D, in example embodiments, the thickness of each group may be reduced in the direction away from the first semiconductor chip 110. In other words, the thickness t1 of the bonding layer 140' of the first group may be reduced to a thickness t4 of the bonding layer 140' of the fourth group in a stepwise manner. Conversely, in other example embodiments, the thickness of each group may be increased in the direction away from the first semiconductor chip 110. In other words, the thickness t1 of the bonding layer 140' of the first group may be increased to the thickness t4 of the bonding layer 140' of the fourth group in a stepwise manner.

Figure 6:
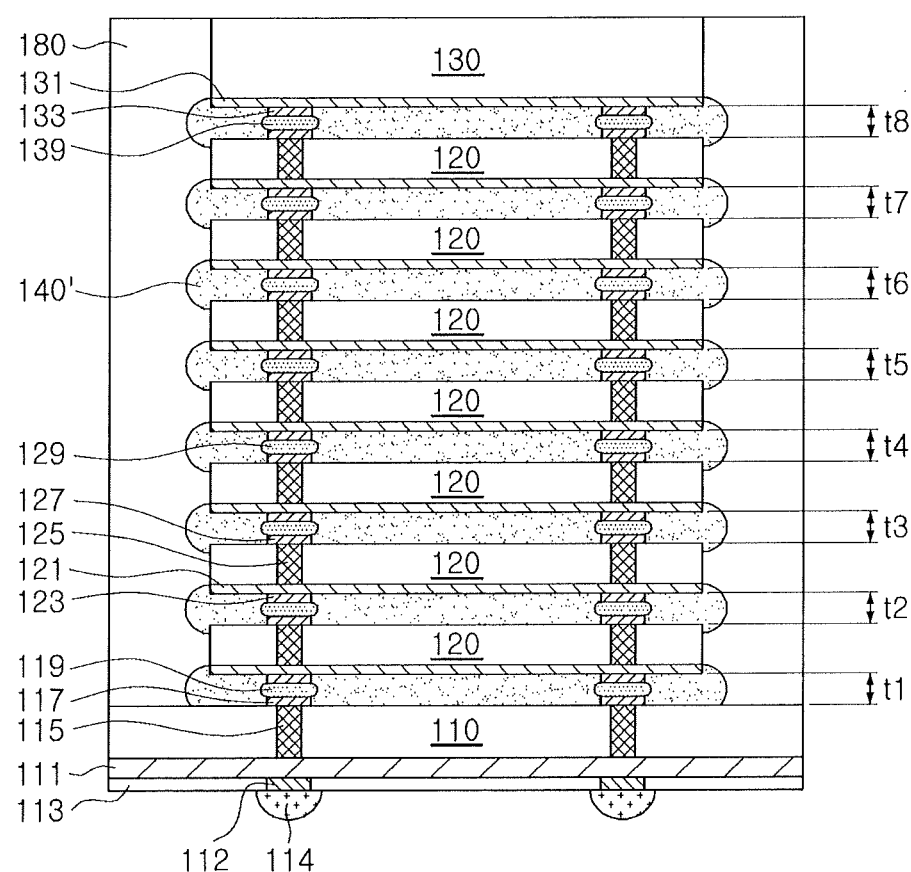

With reference to FIG. 6, in example embodiments, a semiconductor package 100E may include the plurality of bonding layers 140' having different thicknesses, depending on the distance from the first semiconductor chip 110. In example embodiments, eight bonding layers 140' may have different thicknesses t1 to t8 depending on the distance from the first semiconductor chip 110.

In order to reduce warpage of the semiconductor package 100E, in example embodiments, the thickness of respective bonding layers 140' may be gradually reduced in the direction away from the first semiconductor chip 110. Conversely, in other example embodiments, the thickness of respective bonding layers 140' may be gradually increased in the direction away from the first semiconductor chip 110.

In addition, approaches of the example embodiments in FIGS. 1 to 3 may be mixed with example embodiments in FIGS. 4 to 6.

In example embodiments, the semiconductor package may include a plurality of groups of bonding layers having different degrees of curing shrinkage and thicknesses.

In order to reduce warpage of the semiconductor package, in example embodiments, the degree of curing shrinkage and the thickness of each group may be reduced in the direction away from a substrate. Conversely, in other example embodiments, the degree of curing shrinkage and the thickness of each group may be increased in the direction away from the substrate.

FIGS. 7 to 11 are views illustrating a method of manufacturing a semiconductor package according to an example embodiment.

With reference to FIG. 7, a carrier substrate 105 may include a first semiconductor chip 110 thereon. In example embodiments, a semiconductor substrate 101 including a plurality of first semiconductor chips 110 may be bonded to the carrier substrate 105 through a carrier bonding layer 106. The semiconductor substrate 101 may be provided as a wafer-level semiconductor substrate including a semiconductor material, such as silicon, for example.

The first semiconductor substrate 110 may include a circuit wiring layer 111 and a through via 115. An external solder ball 114 may be disposed on a lower surface 110a of the first semiconductor chip 110, and may be electrically connected to the circuit wiring layer 111 by a pad 112. In order for a first semiconductor chip to be electrically connected to a second semiconductor chip stacked in a subsequent process, a first connection pad 117 may be disposed on the through via 115.

With reference to FIG. 8, a plurality of semiconductor chips 120 and 130 may be mounted on the first semiconductor chip 110 of the semiconductor substrate 101. A second semiconductor chip 120 may be mounted on the first semiconductor chip 110 of the semiconductor substrate 101, thus forming a chip-on-wafer (COW) structure. The second semiconductor chip 120 may include an integrated circuit layer 121 and a through via 125. A first bump 119 may be formed on a lower surface 120a of the second semiconductor chip 120, so that the second semiconductor chip 120 may be electrically connected to the first semiconductor chip 110. In example embodiments, the first bump 119 may be formed between the first semiconductor chip 110 and the second semiconductor chip 120. In example embodiments, seven second semiconductor chips 120 may be stacked on the first semiconductor chip 110. In such embodiments, a second bump 129 may be formed between each of second semiconductor chips 120.

A third semiconductor chip 130 may be mounted on the second semiconductor chip 120. The third semiconductor chip 130 may not include a through via. A third bump 139 may be formed between the second semiconductor chip 120 and the third semiconductor chip 130.

A bonding layer 140 may be formed among semiconductor chips 110, 120, and 130. In example embodiments, the bonding layer 140 may be provided as a non-conductive polymer tape including an insulating material.

The first bump 119, the second bump 129, and the bonding layer 140 may be bonded to the lower surface 120a of respective second semiconductor chips 120, and the second semiconductor chip 120 may be stacked on the first semiconductor chip 110 so that the lower surface 120a of the second semiconductor chip 120 may be oriented in a direction of an upper surface 100b of the first semiconductor chip 110. The third bump 139 and the bonding layer 140 may be bonded to the lower surface 130a of the third semiconductor chip 130, and the third semiconductor chip 130 may be stacked on the second semiconductor chip 120 so that the lower surface 130a of the third semiconductor chip 130 may be oriented in the direction of the upper surface 100b of the first semiconductor chip 110.

In example embodiments, the first bonding layer 140a bonded to the lower surface 120a of four second semiconductor chip 120 disposed adjacently to the first semiconductor chip 110 may have physical properties different from those of the second bonding layer 140b bonded to the lower surface 120a of three remaining second semiconductor chips 120 and the lower surface 130a of the third semiconductor chip 130. The first bonding layer 140a and the second bonding layer 140b may have different degrees of curing shrinkage, for example.

In example embodiments, a process of stacking the second semiconductor chip 120 and the third semiconductor chip 130 may be performed at a temperature of around 300° C. In such embodiments, a portion of the bonding layer 140 may protrude from an external surface of the second semiconductor chip 120 and the third semiconductor chip 130.

Figure 9:
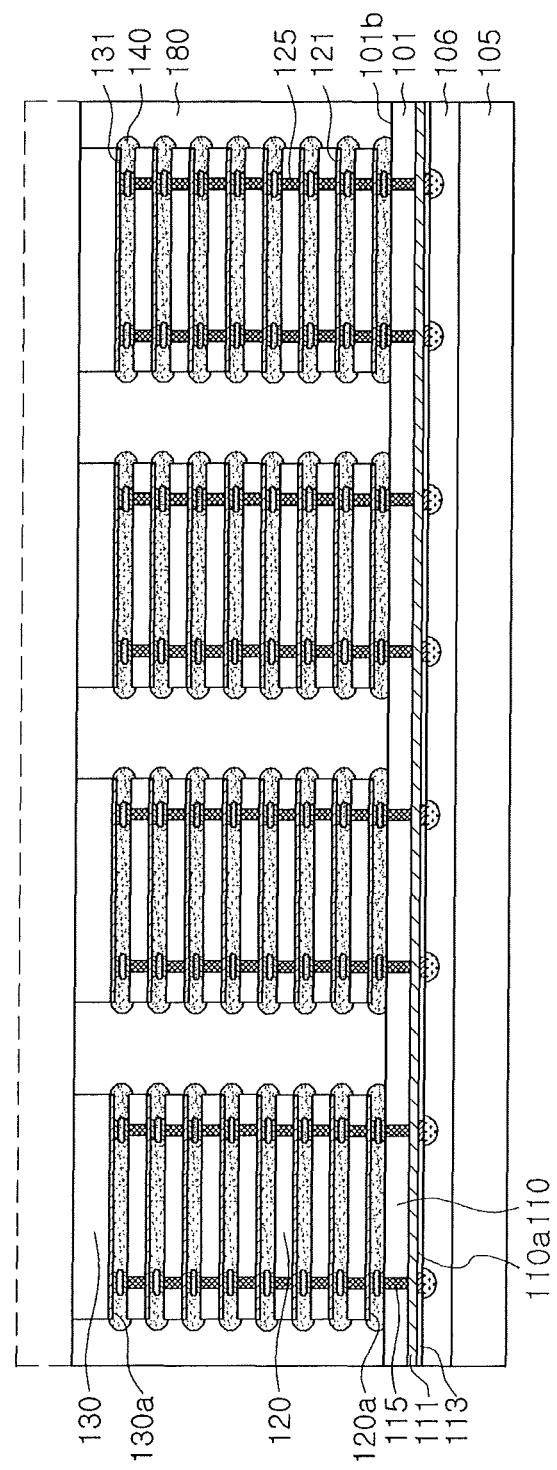

With reference to FIG. 9, a molded film 180 covering the second semiconductor chip 120 and the third semiconductor chip 130 may be formed on the upper surface 100b of the semiconductor substrate 101. The molded film 180 may include an insulating polymer material (e.g., an epoxy molding compound).

An upper surface of the molded film 180 may be ground away. As illustrated using a dotted line, a portion of the molded film 180 may be removed, so that an upper surface of the third semiconductor chip 130 may be outwardly exposed. In such embodiments, the third semiconductor chip 130 may also be ground away, and, in this manner, the thickness of the third semiconductor chip 130 may be adjusted. Alternatively, the third semiconductor chip 130 may not be ground away.

Figure 10:
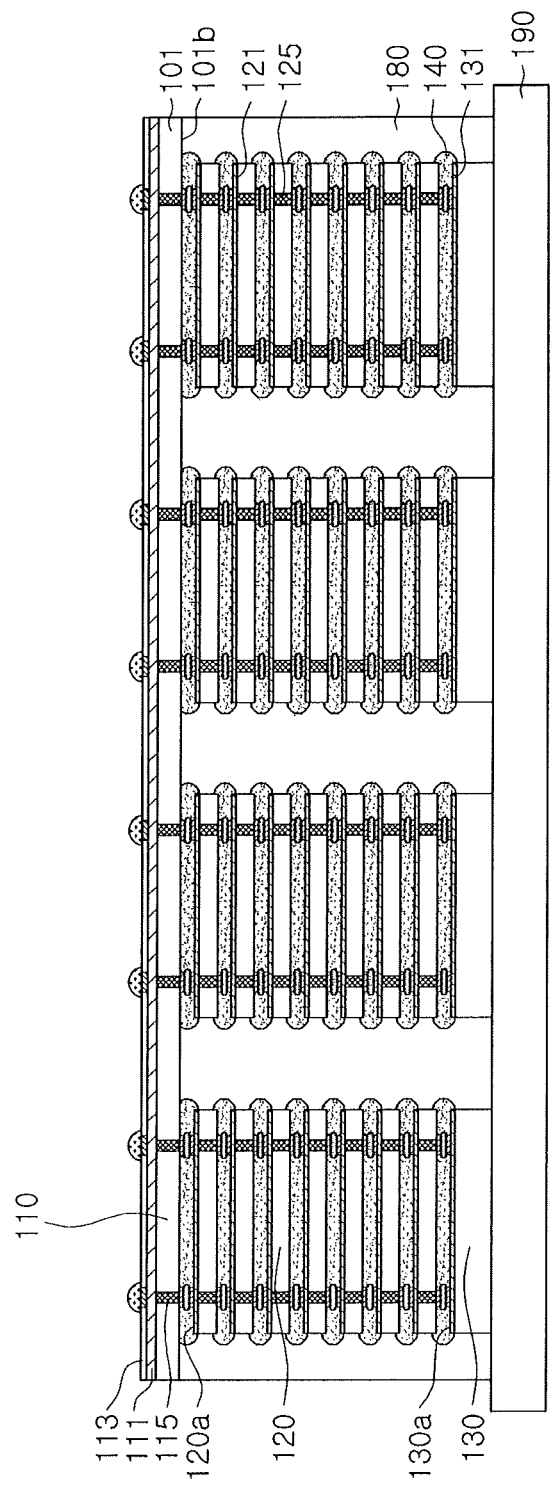
Figure 11:
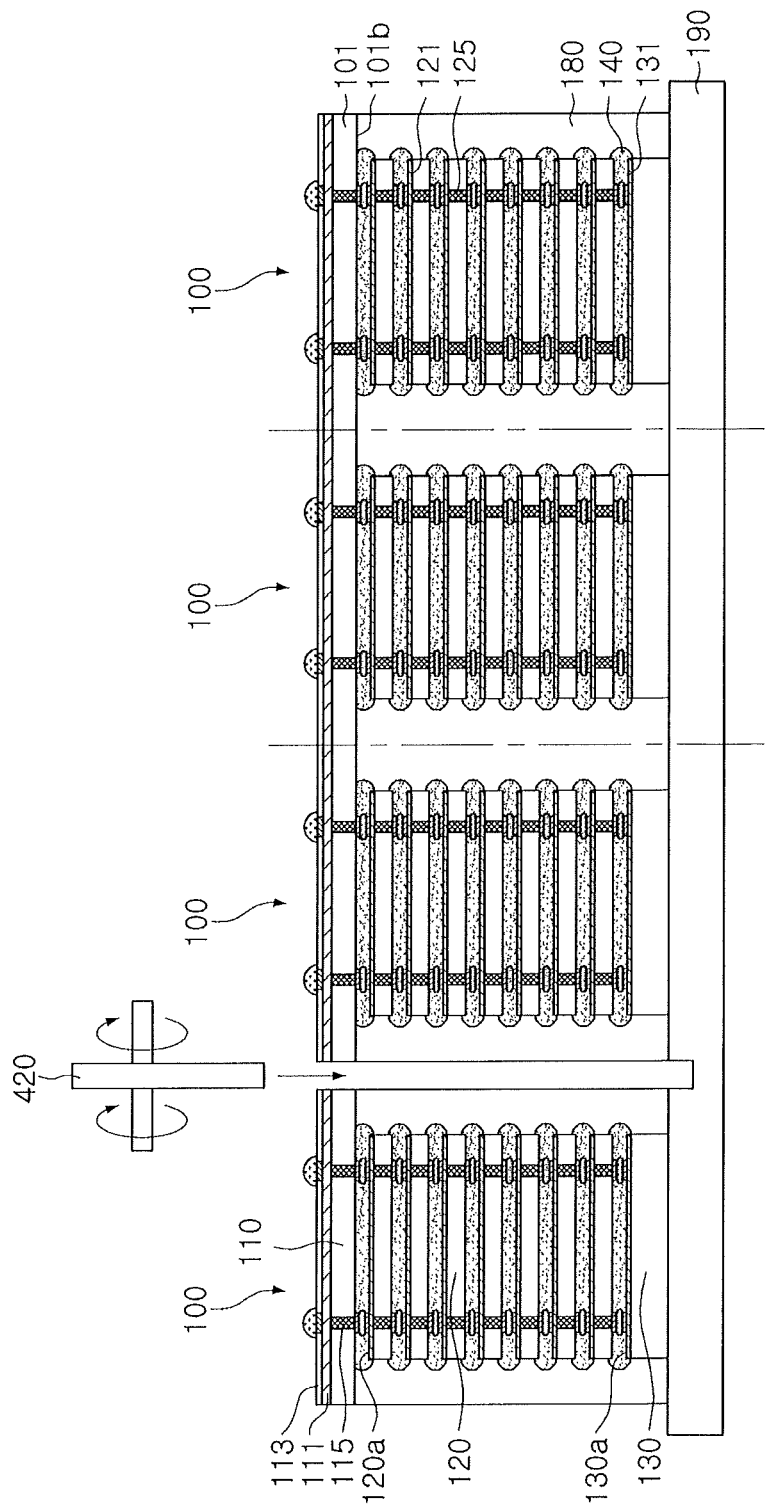

With reference to FIG. 10, the molded film 180 and the third semiconductor chip 130 may be bonded to an adhesive film 190. In example embodiments, the semiconductor substrate 101 may be inverted to be disposed on the adhesive film 190 so that the carrier substrate 105 may face upwards. Subsequently, the carrier substrate 105 and the carrier bonding layer 106 may be removed. With reference to FIG. 11, a cutting process may be applied to the semiconductor substrate 101 and the molded film 180, so that manufacturing of semiconductor packages 100 bonded to the adhesive film 190 may be completed. The cutting process may be performed in a direction perpendicular to a lower surface 100a of the semiconductor substrate 101 using a blade 420 or a laser, for example. In descriptions of the cutting process above, terms "an upper surface" and "a lower surface" may be used in a manner the same as those of FIGS. 7 to 9, regardless of an up and down direction.

Subsequently, the adhesive film 190 may be removed, and semiconductor packages 100 may be separated.

Figure 12:
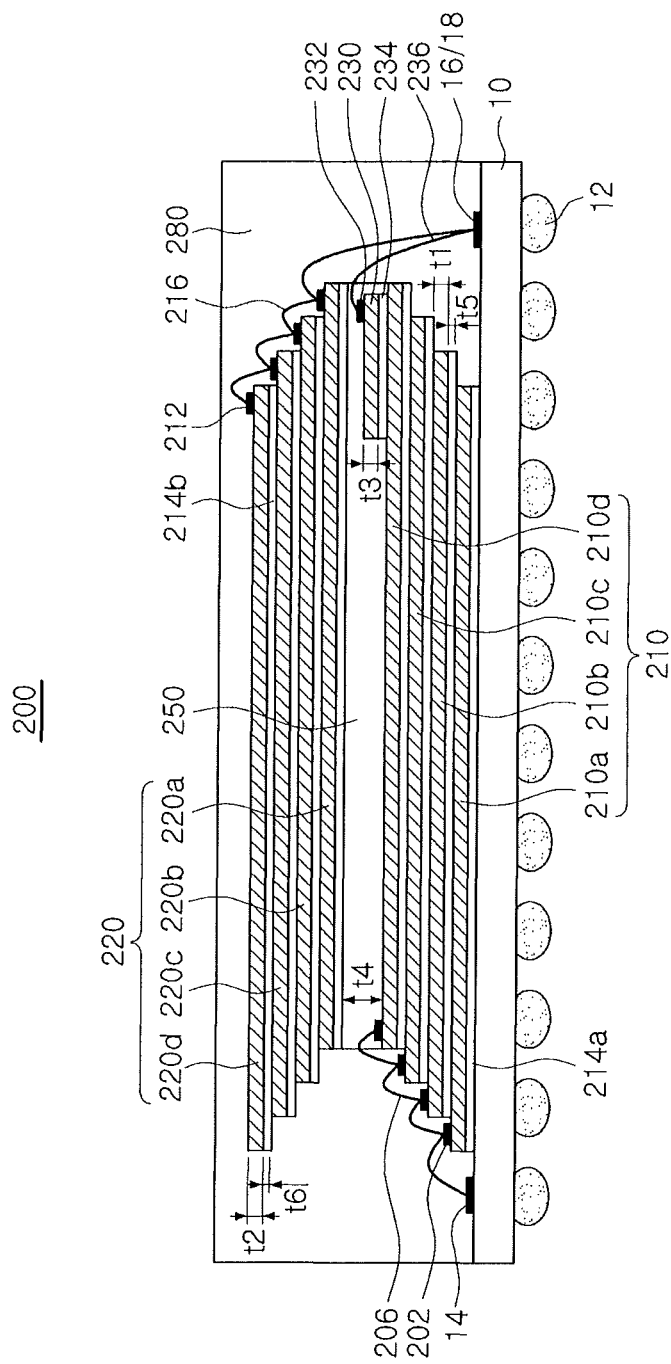
FIG. 12 is a cross-sectional view of a semiconductor package according to an example embodiment.

FIG. 12 is a cross-sectional view of a semiconductor package according to an example embodiment.

With reference to FIG. 12, in a semiconductor package 200 in accordance with principles of inventive concepts, a first semiconductor chip portion 210 and a second semiconductor chip portion 220 may be stacked on a base substrate 10, and a third semiconductor chip 230 may be stacked to be disposed between the first semiconductor chip portion 210 and the second semiconductor chip portion 220. In the semiconductor package 200, the first semiconductor chip portion 210, the third semiconductor chip 230, and the second semiconductor chip portion 220 may be stacked on the base substrate 10 in sequence.

An external connection terminal 12 may be formed on a lower surface of the base substrate 10, while connection pads 14, 16, and 18 may be formed on an upper surface of the base substrate 10. In example embodiments, the base substrate 10 may be provided as a printed circuit board (PCB) or a silicon substrate. The silicon substrate may include a semiconductor chip. The external connection terminal 12 may be provided as a solder ball, for example. The connection pads 14, 16, and 18 may be electrically connected to the external connection terminal 12 through an interior of the base substrate 10. A single connection pad among the connection pads 14, 16, and 18 may be connected to one or more different connection pads through the upper surface of the interior of the base substrate 10. The connection pads 14, 16, and 18 may include a first connection pad 14 electrically connected to the first semiconductor chip portion 210, a second connection pad 16 electrically connected to the second semiconductor chip portion 220, and a third connection pad 18 electrically connected to the third semiconductor chip 230. The first semiconductor chip portion 210 may be electrically connected to the first connection pad 14 through a first bonding wire 206. The second semiconductor chip portion 220 may be electrically connected to the second connection pad 16 through a second bonding wire 216. The third semiconductor chip 230 may be electrically connected to the third connection pad 18 by a third bonding wire 236.

The first semiconductor chip portion 210 may include a plurality of first semiconductor chips 210*a*, 210*b*, 210*c*, and 210*d*. In example embodiments, the plurality of first semiconductor chips 210*a*, 210*b*, 210*c*, and 210*d* may have the same area. The plurality of first semiconductor chips 210*a*, 210*b*, 210*c*, and 210*d* may be stacked on the base substrate 10 in sequence in a direction perpendicular to the base substrate 10 (that is, perpendicular to a plane described by the top surface of the base substrate 10).

Each of the plurality of first semiconductor chips 210*a*, 210*b*, 210*c*, and 210*d* may include a first pad 202 connected to the first bonding wire 206. The first pad 202 may be formed on an active surface of the plurality of first semiconductor chips 210*a*, 210*b*, 210*c*, and 210*d*. Each of the plurality of first semiconductor chips 210*a*, 210*b*, 210*c*, and 210*d* may be stacked to allow the active surface thereof to face upwards. Each of the plurality of first semiconductor chips 210*a*, 210*b*, 210*c*, and 210*d* may be stacked on the base substrate 10 through a first bonding layer 214*a*. The plurality of first semiconductor chips 210*a*, 210*b*, 210*c*, and 210*d* may include the first bonding layer 214*a* bonded to a lower surface thereof in advance, and each of the plurality of first semiconductor chips 210*a*, 210*b*, 210*c*, and 210*d* may be stacked on the base substrate 10 in sequence.

Each of the plurality of first semiconductor chips 210*a*, 210*b*, 210*c*, and 210*d* may be stacked after being shifted in a horizontal direction so that a portion of an upper surface thereof, upon which the first pad 202 is formed, may be exposed. The first bonding wire 206 may connect the first pads 202 disposed from a first semiconductor chip 210*d* disposed in tops of the first semiconductor chips to a first semiconductor chip 210*a* disposed in bottoms thereof, in sequence, and may be connected to the first connection pad 14 of the base substrate 10. However, inventive concepts are not limited thereto. The first bonding wire 206 may also connect the first pads 202 of the plurality of first semiconductor chips 210*a*, 210*b*, 210*c*, and 210*d* to the first connection pad 14 of the base substrate 10, respectively.

The third semiconductor chip 230 may be stacked on the first semiconductor chip 210*d* disposed in the tops of the first semiconductor chips. In example embodiments, the third semiconductor chip 230 may have an area smaller than that of the first semiconductor chip 210*d* disposed in the tops of the first semiconductor chips.

The third semiconductor chip 230 may include a third pad 232 connected to the third bonding wire 236. The third semiconductor chip 230 may be bonded to the first semiconductor chip 210*d* disposed in the tops of the first semiconductor chips through a third die attaching film 234. The third bonding wire 236 may connect the third pad 232 to the third connection pad 18 of the base substrate 10.

The second semiconductor chip portion 220 may be stacked on the first semiconductor chip portion 210 and the third semiconductor chip 230. The second semiconductor chip portion 220 may include a plurality of second semiconductor chips 220*a*, 220*b*, 220*c*, and 220*d*. The plurality of second semiconductor chips 220*a*, 220*b*, 220*c*, and 220*d* may have the same area. Each of the plurality of second semiconductor chips 220*a*, 220*b*, 220*c*, and 220*d* may have an area greater than that of the third semiconductor chip 230. The plurality of second semiconductor chips 220*a*, 220*b*, 220*c*, and 220*d* may be stacked on the first semiconductor chip portion 210 and the third semiconductor chip 230 in sequence in a vertical direction. Each of the plurality of second semiconductor chips 220*a*, 220*b*, 220*c*, and 220*d* may be stacked to allow the active surface thereof to face upwards. Each of the plurality of second semiconductor chips 220*a*, 220*b*, 220*c*, and 220*d* may be stacked on the first semiconductor chip portion 210 and the third semiconductor chip 230 through a second bonding layer 214*b*. The plurality of second semiconductor chips 220*a*, 220*b*, 220*c*, and 220*d* may include the second bonding layer 214*b* bonded to the lower surface thereof in advance, and each of the plurality of second semiconductor chips 220*a*, 220*b*, 220*c*, and 220*d* may be stacked on the third semiconductor chip 230 in sequence. In example embodiments, the second bonding layer 214*b* may have physical properties different from that of the first bonding layer 214*a*. For example, the second bonding layer 214*b* may have a degree of curing shrinkage different from that of the first bonding layer 214*a*.

Each of the plurality of second semiconductor chips 220*a*, 220*b*, 220*c*, and 220*d* may include a second pad 212 connected to the second bonding wire 216. Each of the plurality of second semiconductor chips 220*a*, 220*b*, 220*c*, and 220*d* may be stacked after being shifted in the horizontal direction so that a portion of an upper surface thereof, on which the second pad 212 is formed, may be exposed. The second bonding wire 216 may connect the second pads 212 disposed from a second semiconductor chip 220*d* disposed in tops of the second semiconductor chips to a second semiconductor chip 220*a* disposed in bottoms thereof, in sequence, and may be connected to the second connection pad 16 of the base substrate 10. However, inventive concepts are not limited thereto. The second bonding wire 216 may also connect the second pads 212 of the plurality of second semiconductor chips 220*a*, 220*b*, 220*c*, and 220*d* to the second connection pad 16 of the base substrate 10, respectively.

An insulating material layer 250 may be disposed in a lower portion of the second semiconductor chip portion 220, that is, on a lower surface of the second semiconductor chip 220*a* disposed in the bottoms of the second semiconductor chips. The insulating material layer 250 may be formed to surround at least one portion of the third semiconductor chip 230. The thickness t4 of the insulating material layer 250 may be greater than the thickness t3 of the third semiconductor chip 230. The thickness t4 of the insulating material layer 250 may be greater than the thickness t5 of the first bonding layer 214*a* or the thickness t6 of the second bonding layer 214*b*, for example.

Because the third semiconductor chip 230 is surrounded by the insulating material layer 250, the thickness t3 of the third semiconductor chip 230 may be less than the thickness t1 of respective first semiconductor chips 210*a*, 210*b*, 210*c*, and 210*d* or a thickness t2 of respective second semiconductor chips 220*a*, 220*b*, 220*c*, and 220*d*.

The insulating material layer 250 may surround the third semiconductor chip 230, and may include a material supporting the second semiconductor chip portion 220 stacked on an upper side thereof. In example embodiments, the insulating material layer 250 may include an epoxy resin, an acrylic resin, polyimide or combinations thereof.

The insulating material layer 250 may be formed in such a manner that the third semiconductor chip 230 is bonded thereto, the first bonding wire 206 and the third bonding wire 236 are formed, and the insulating material layer 250 is coated on the first semiconductor chip 210*d* disposed in the tops of the first semiconductor chips and the third semiconductor chip 230. Alternatively, the insulating material layer 250 may be formed in such a manner that the insulating material layer 250 is bonded to the lower surface of the second semiconductor chip 220*a* disposed in the bottoms of the second semiconductor chips, and the second semiconductor chip 220*a* is bonded to the first semiconductor chip 210*d* disposed in the tops of the first semiconductor chips and the third semiconductor chip 230.

The plurality of first semiconductor chips 210*a*, 210*b*, 210*c*, and 210*d* and the plurality of second semiconductor chips 220*a*, 220*b*, 220*c*, and 220*d* may be provided as a homogeneous semiconductor chip having the same area (that is, may all be the same type of semiconductor chips). For example, the plurality of first semiconductor chips 210*a*, 210*b*, 210*c*, and 210*d* and the plurality of second semiconductor chips 220*a*, 220*b*, 220*c*, and 220*d* may be provided as a memory semiconductor chip. In example embodiments, the third semiconductor chip 230 may be provided as a semiconductor chip providing a controller, a buffer, a cache memory, a power semiconductor device, needed in using the plurality of first semiconductor chips 210*a*, 210*b*, 210*c*, and 210*d* and the plurality of second semiconductor chips 220*a*, 220*b*, 220*c*, and 220*d*. For example, the third semiconductor chip 230 may be provided as a controller chip, a dynamic random access memory (DRAM), a static random access memory (SRAM), or an intelligent power device (IPD).

A mold (or molding) layer 280 encompassing an entirety of the first semiconductor chip portion 210, the second semiconductor chip portion 220, and the third semiconductor chip 230 may be formed on the base substrate 10. The mold layer 280 may encompass an entirety of the first semiconductor chip portion 210, the second semiconductor chip portion 220, and the third semiconductor chip 230, and the first connection pad 14, the second connection pad 16, and the third connection pad 18, on the base substrate 10, and the first bonding wire 206, the second bonding wire 216, and the third bonding wire 236. In example embodiments, the mold layer 280 may include an epoxy molding compound (EMC).

Figure 13:
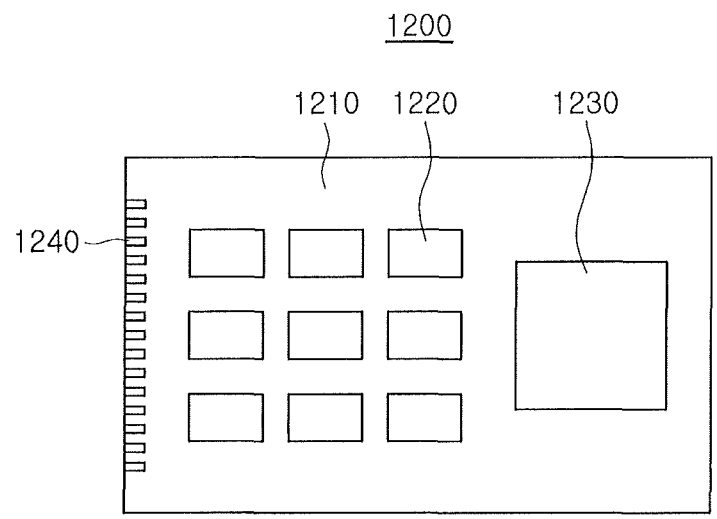
FIG. 13 is a view of an example of a package module including a semiconductor package according to an example embodiment.
Figure 14:
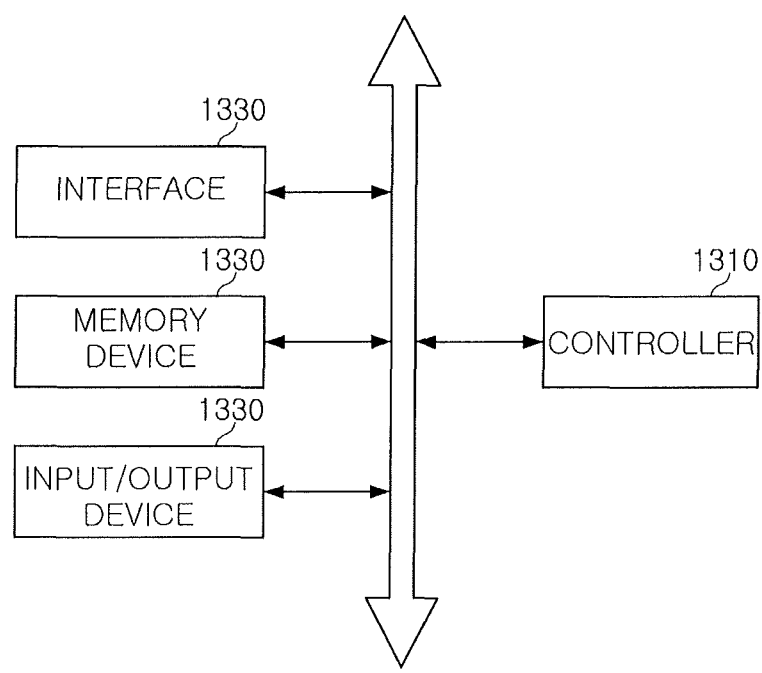
FIG. 14 is a block diagram of an example of an electronic system including a semiconductor package according to an example embodiment.
Figure 15:
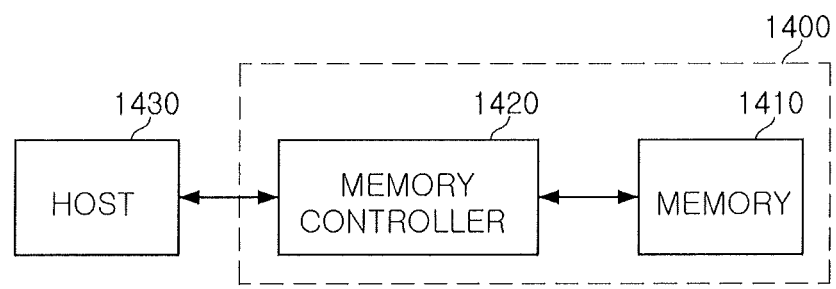
FIG. 15 is a block diagram of an example of a memory card including a semiconductor package according to an example embodiment of the present inventive concept.

FIG. 13 is a view of an example of a package module including a semiconductor package in accordance with principles of inventive concepts. FIG. 14 is a block diagram of an example of an electronic system including a semiconductor package in accordance with principles of inventive concepts. FIG. 15 is a block diagram of an example of a memory card including a semiconductor package in accordance with principles of inventive concepts.

With reference to FIG. 13, a package module 1200 may be provided to have a form the same as that of a semiconductor integrated circuit chip 1220 and a quad flat package (QFP) semiconductor integrated circuit chip 1230. Semiconductor devices 1220 and 1230 may include at least one of semiconductor packages according to example embodiments in accordance with principles of inventive concepts. The package module 1200 may be connected to an external electronic device by an external connection terminal 1240 disposed on a side of a substrate 1210.

With reference to FIG. 14, an electronic system 1300 may include a controller 1310, an input/output device 1320, and a memory device 1330. The controller 1310, the input/output device 1320, and the memory device 1330 may be combined through a bus 1350.

The bus 1350 may form a passage through which data may be transferred. In example embodiments, the controller 1310 may include at least one among: a microprocessor, a digital signal processor, a microcontroller, and logic elements performing a function the same thereas. The controller 1310 and the memory device 1330 may include at least one among semiconductor packages according to example embodiments. The input/output device 1320 may include at least one selected from a keypad, a keyboard, a display device, or the like. The memory device 1330 may be provided as a device to store data. The memory device 1330 may store data and/or a command run by the controller 1310, and the like. The memory device 1330 may include a volatile memory device and/or a non-volatile memory device. Alternatively, the memory device 1330 may be provided as a flash memory. For example, the flash memory to which the present inventive concept is applied may be mounted on an information processing system, such as a mobile device or a desktop computer. The flash memory may include, or be implemented as, a solid state disk (SSD). In such example embodiments, the electronic system 1300 may stably store a large amount of data in the flash memory. The electronic system 1300 may further include an interface 1340 to transmit data to a communications network or receive data therefrom. The interface 1340 may be provided as a wired or wireless type. In example embodiments, the interface 1340 may include an antenna, a wired or wireless transceiver, or the like. In the electronic system 1300, an application chipset, a camera image processor (CIS), an input/output device, and the like may be further provided, which are not illustrated.

The electronic system 1300 may be provided as a mobile system, a personal computer, an industrial computer, a logic system performing various functions, or the like. For example, the mobile system may be provided as one among: a personal digital assistant (PDA), a portable computer, a web tablet, a mobile phone, a wireless phone, a laptop computer, a memory card, a digital music system, and an information transmitting/receiving system. In embodiments in which the electronic system 1300 is provided as an apparatus to carry out wireless communications, the electronic system 1300 may be used in a communications interface protocol, such as a third generation communications system (e.g., CDMA, GSM, NADC, E-TDMA, WCDAM, and CDMA2000).

With reference to FIG. 15, a memory card 1400 may include a non-volatile memory device 1410 and a memory controller 1420.

The non-volatile memory device 1410 and the memory controller 1420 may store data or read stored data. The non-volatile memory device 1410 may include at least one among semiconductor packages in accordance with principles of inventive concepts. The memory controller 1420 may read the stored data in response to a reading/writing request by a host or control the non-volatile memory device 1410 to store data.

As set forth above, according to example embodiments of the present inventive concept, a semiconductor package having reduced warpage may be provided. In addition, according to example embodiments in accordance with principles of inventive concepts, the semiconductor package having improved reliability may be provided.

While example embodiments have been shown and described above, it will be apparent to those skilled in the art that modifications and variations could be made without departing from the spirit and scope of inventive concepts as defined by the appended claims.

What is claimed is:

1. A semiconductor package, comprising:
a substrate;
a plurality of semiconductor chips stacked on the substrate; and
a plurality of bonding layers bonded to lower surfaces of the plurality of semiconductor chips,
wherein the plurality of bonding layers are divided into a plurality of groups, each group having different physical properties depending on a distance from the substrate, and
wherein each of the plurality of groups have at least one of different degrees of curing shrinkage, different coefficients of thermal expansion and different thicknesses depending on the distance from the substrate.

2. The semiconductor package of claim 1, wherein each of the plurality of groups comprise materials having different degrees of curing shrinkage.

3. The semiconductor package of claim 2, wherein each of the plurality of groups comprise materials having reduced degrees of curing shrinkage in a direction away from the substrate.

4. The semiconductor package of claim 2, wherein each of the plurality of groups comprise materials having increased degrees of curing shrinkage in a direction away from the substrate.

5. The semiconductor package of claim 1, wherein each of the plurality of groups comprise materials having different coefficients of thermal expansion.

6. The semiconductor package of claim 5, wherein each of the plurality of groups comprise materials having reduced coefficients of thermal expansion in a direction away from the substrate.

7. The semiconductor package of claim 5, wherein each of the plurality of groups comprise materials having increased coefficients of thermal expansion in a direction away from the substrate.

8. The semiconductor package of claim 1, wherein each of the plurality of groups comprise the same material, but have different thicknesses.

9. The semiconductor package of claim 8, wherein each of the plurality of groups are reduced in thickness in a direction away from the substrate.

10. The semiconductor package of claim 8, wherein each of the plurality of groups are increased in thickness in a direction away from the substrate.

11. The semiconductor package of claim 1, wherein each of the plurality of groups have different degrees of curing shrinkage and thicknesses.

12. The semiconductor package of claim 11, wherein each of the plurality of groups comprise materials having reduced degrees of curing shrinkage and are reduced in thickness in a direction away from the substrate.

13. The semiconductor package of claim 11, wherein each of the plurality of groups comprise materials having increased degrees of curing shrinkage and are increased in thickness in a direction away from the substrate.

14. The semiconductor package of claim 1, wherein each of the plurality of bonding layers are provided as a non-conductive polymer tape including an insulating material.

15. The semiconductor package of claim 1, further comprising through vias penetrating through the plurality of semiconductor chips.

16. The semiconductor package of claim 1, further comprising a connection bump interposed between the plurality of semiconductor chips to electrically connect the plurality of semiconductor chips to each other.

17. The semiconductor package of claim 1, further comprising wires electrically connecting at least one portion of the plurality of semiconductor chips to each other.

18. A semiconductor package, comprising:
a substrate; and
a plurality of semiconductor chips stacked on the substrate through bonding layers, each bonding layer having different physical properties depending on a distance from the substrate chosen from among: thermal coefficient of expansion, the degree of curing shrinkage, and Young's modulus.

19. A semiconductor package, comprising:
a substrate;
semiconductor chips stacked on the substrate;
through vias penetrating through the semiconductor chips;
bumps disposed between the semiconductor chips and connected to the through vias;
bonding layers disposed between the semiconductor chips, surrounding the bumps, and having different physical properties; and
a molding portion surrounding the semiconductor chips and the bonding layers,
wherein the different physical properties comprise at least one of different degrees of curing shrinkage and different thicknesses.

20. The semiconductor package of claim 19, wherein the different physical property further includes at least one of thermal coefficient of expansion and Young's modulus.

* * * * *